United States Patent [19]

Kraft

[11] 3,731,372

[45] May 8, 1973

[54] METHOD OF FORMING A LOW-OHMIC CONTACT TO A SEMICONDUCTOR DEVICE

[75] Inventor: Wolfgang Kraft, Freiburg i. Br., Germany

[73] Assignee: ITT Industries, Inc., New York, N.Y.

[22] Filed: Mar. 15, 1971

[21] Appl. No.: 124,094

[30] Foreign Application Priority Data

Apr. 10, 1970 Germany....................P 20 17 228.5

[52] U.S. Cl........................................29/590, 29/591

[51] Int. Cl...............................................B01j 17/00

[58] Field of Search........................29/578, 589, 590, 29/591; 148/190

[56] References Cited

UNITED STATES PATENTS

| | | | |
|---|---|---|---|
| 3,474,309 | 10/1969 | Stehlin | 29/578 |
| 3,479,736 | 11/1969 | Toki et al. | 29/589 |

*Primary Examiner*—Charles W. Lanham

*Assistant Examiner*—W. Tupman

*Attorney*—C. Cornell Remsen, Jr., Walter J. Baum, Paul W. Hemminger, Charles L. Johnson, Jr., Philip M. Bolton, Isidore Togut, Edward Goldberg and Menotti J. Lombardi, Jr.

[57] ABSTRACT

A low ohmic contact for a semiconductor device is made to a p-conductivity type region by diffusing some n conductivity type phosphorous into said region before the contact metal is applied to said region. The amount of phosphorous is kept at a minimum to prevent the formation of an unwanted pn junction.

9 Claims, 9 Drawing Figures

INVENTOR
WOLFGANG KRAFT
BY Stephen A. Young
ATTORNEY

INVENTOR

WOLFGANG KRAFT

BY Stephen G. Tolany

ATTORNEY

INVENTOR
WOLFGANG KRAFT

BY Stephen G. Young
ATTORNEY

METHOD OF FORMING A LOW-OHMIC CONTACT TO A SEMICONDUCTOR DEVICE

BACKGROUND OF THE INVENTION

This invention relates to a method of manufacturing low-ohmic contacts to a semiconductor device. For the purpose of establishing ohmic contacts, in particular for monolithic solid-state integrated circuits, it is known to attach aluminum in the form of strip lines or contact areas to the zones to be contacted by depositing a layer of aluminum on to the semiconductor body, which body, in the case of solid-state circuits, is partly protected by an insulating layer.

In semiconductor technology the term low-ohmic contact refers to an essentially barrier-free contact. Conventional low-ohmic contacts to the zones in a semiconductor body of silicon, formed by depositing metal layers to said body, are incapable of meeting higher requirements. In semiconductor engineering, metal layers of aluminum or nickel are preferably used for establishing low-ohmic contacts and zones in silicon bodies, because these metals result in essentially barrier-free contacts to p- as well as n-conductivity type zones, when subjected to a thermal-treatment after deposition, preferably without forming a liquid phase.

SUMMARY OF THE INVENTION

The invention is based on the discovery that low-ohmic contacts can be formed during the aforementioned thermal-treatment, if the contact zone is doped with phosphorous, while using contacting metals such as nickel and aluminum.

It is an object of this invention to provide a method of establishing a low-ohmic contact to the p-conductivity type zone of a silicon semi-conductor body by depositing a metal which, after thermal-treatment, will result in an ohmic contact. According to a broad aspect of this invention, there is provided a low-ohmic contact to p-conductivity type zone by diffusing a small concentration of phosphorous into the p-conductivity type surface zone, wherein during the subsequent thermal-treatment, the contact zone is brought into contact with the contact metal.

Basically, the low-ohmic contact according to the invention, is obtained when inserting into the contact zone, a surface zone of smaller doping concentration of phosphorous than the doping concentration of the contact zone. A slight re-doping of the contact zone by a somewhat higher doping concentration of phosphorous, however, can be rendered harmless again by the alloying during the thermal-treatment with or without the formation of a liquid phase, when the contact metal permeates the surface zone.

The preferred contact metals are aluminum and nickel. However, other metals can be used to form a low-ohmic contact by forming a suitable alloy with the phosphorous during the aforementioned thermal-treatment.

The use of the inventive method is particularly suitable for establish-ing low-ohmic contacts to p-conductivity type base zones of planar transis-tor elements in monolithic solid-state circuits, because a photolithographic process step and an oxidation process step are saved, and structures of reduced size can be realized.

DESCRIPTION OF THE PREFERRED EMBODIMENTS

Figure 1:
FIGS. 1 to 7 partly and in cross-sectional view, illustrate the contacting of the base zone of a planar transistor element according to the inventive method.
Figure 2:
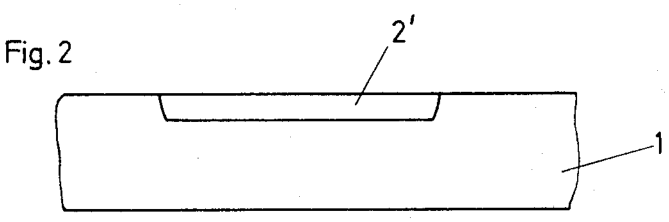
Figure 3:
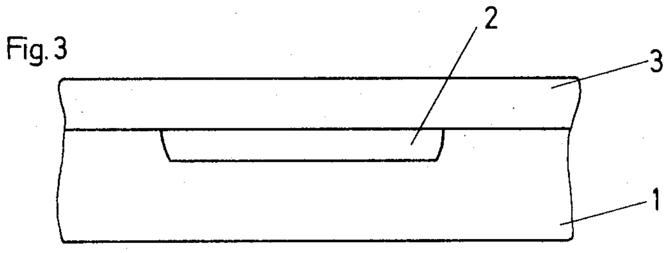

For manufacturing a planar transistor element within a monolithic solid-state circuit, a low-ohmic p-conductivity type substrate 1, (e.g. 0.2 ohm-cm) is used. In accordance with FIG. 2, an $n^+$-doped layer 2' with antimony is diffused within the substrate. Thereupon according to FIG. 3, a layer 3 n-conductivity is deposited on the substrate surface so that there will result a highly doped intermediate layer 2.

Figure 4:
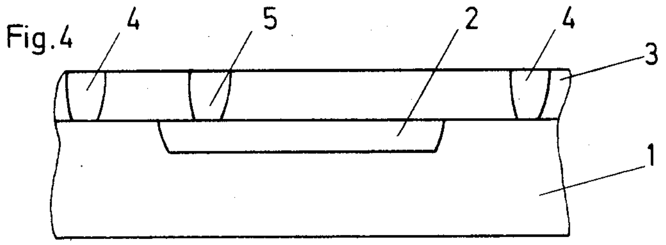

The epitaxial layer 3 has a thickness of 10 $\mu$m and a surface resistivity of 1 to 5 ohm-cm. Subsequently thereto, by employing the well-known planar method according to FIG. 4, there is inserted the isolating zone 4 customary for effecting the separation with respect to direct current of the individual elements of a monolithic solid-state circuit, as well as the contact zone 5 according to the invention, by diffusing boron within layer 3 so that zone 4 extends down to substrate 1. This diffusion is carried out at a temperature of 1,220°C. at first for a period of 5 minutes in a dry oxygen atmosphere, and thereupon, for about 1½ hours in nitrogen. The diffusion period is supposed to be just sufficient for reaching the opposite p-zone of the substrate, and should be as short as possible in order to prevent the diffusing contact zone 5 from acting too strongly upon the donors (donators) so as to cause the n-dopants to diffuse out of the intermediate layer 2, thus causing a reduction of the breakdown voltage between the collector zone and the base zone 6 of the planar transistor component. A higher base-collector breakdown voltage can be obtained using a relatively highly doped substrate having a resistivity of 0.2 ohm-cm, since the p-dopant material of the substrate, also diffuse in opposition to the dopings of the isolating zone 4. Therefore, maybe the shorter the diffusion period, the higher is the doping of the substrate 1. The doping profiles formed from the out diffusion from substrate 1 and the intermediate layer 2 during the diffusion of both the isolating zone 4 and the contact zone 5, are indicated by the dashed lines in FIG. 4.

Figure 5:
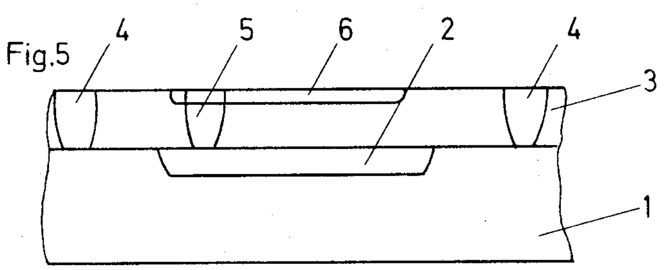
Figure 6:
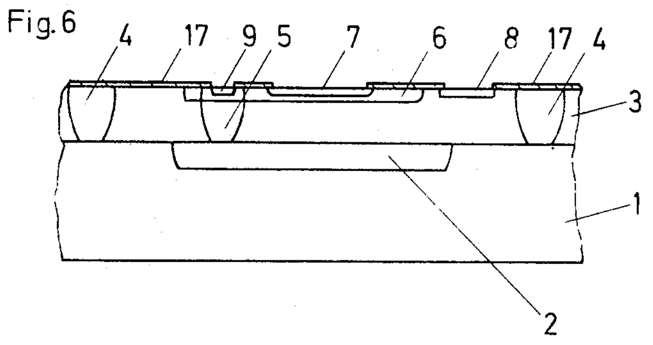

According to FIG. 5, base zone 6 is formed in the usual manner and zone 6 must at least touch the contact zone 5. Thereupon, the planar method is carried out according to FIG. 6, by depositing an oxide mask 17 which, in the usual way, comprises openings or apertures for diffusing the emitter zone 7, the contact zone 8 of the collector zone, and in accordance with the inventive method, one opening or aperture for diffusing the surface zone 9. Through all of these openings or apertures phosphorous is diffused therethrough. Phosphorous diffusion is carried out in an atmosphere containing an inert carrier gas, preferably nitrogen or argon, and a phosphine compound ($PH_3$). The doping concentration of the surface zone 9 may not or only slightly exceed the doping concentration of contact zone 5 in order to insure that a PN junction doesn't form between contact zone 5 and surface zone 9 during thermal-treatment. A slight re-doping at a doping concentration of the surface zone 9 which is slightly increased with respect to the contact zone 5, can be eliminated during thermal-treatment upon deposition of the contact metal, by letting the contact metal permeate the surface zone 9.

Subsequently to the actual phosphorous diffusion it is possible to oxidize the surface and produce a delicately thin invisible glaze of phosphorous on the surface. This delicately thin film of phosphorous can be removed within a few seconds by dipping the semiconductor wafer into a diluted hydrofluoric acid solution.

This is followed in the usual way by the contacting of the zones by evaporating aluminum throughout the entire surface, etching out the contact leads using standard photolithographic and etching techniques. The aluminum is then sintered into the zones to be contacted at a temperature of about 500°C. for periods of ten to twenty minutes in a nitrogen atmosphere.

Figure 7:
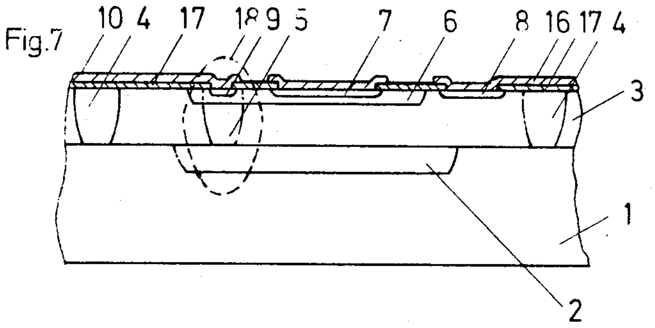
Figure 8:
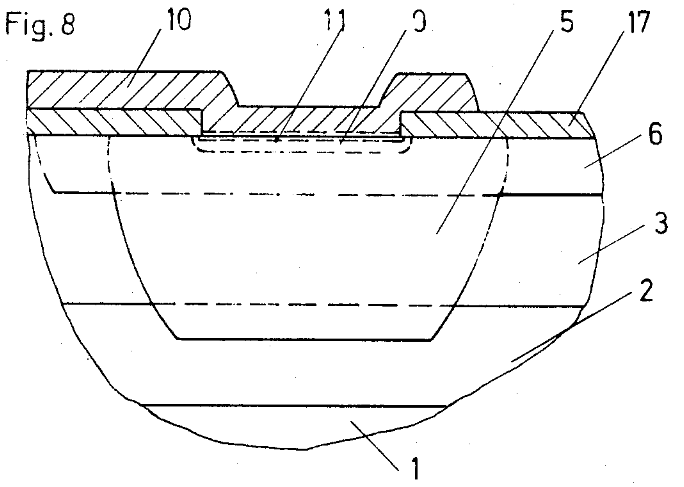
FIG. 8 is a section of FIG. 7, and shows the contacting of the base zone.

FIG. 8 shows the dashed line portion 18 in FIG. 7, on an enlarged scale. On the silicon oxide layer 17 of the semiconductor body there is arranged the strip line 10 of aluminum which contacts the contact zone 5 through the opening or aperture as provided in the silicon oxide layer 17. Within the contacting area there is arranged on the semiconductor surface, a surface zone 9 into which the aluminum is sintered. The contact zone 5 permeates the base zone 6 which is of the same conductivity type, until reaching the intermediate layer 2 so as to reduce the lead or spreading resistance which extends to the collector electrode 16 (FIG. 7).

Figure 9:
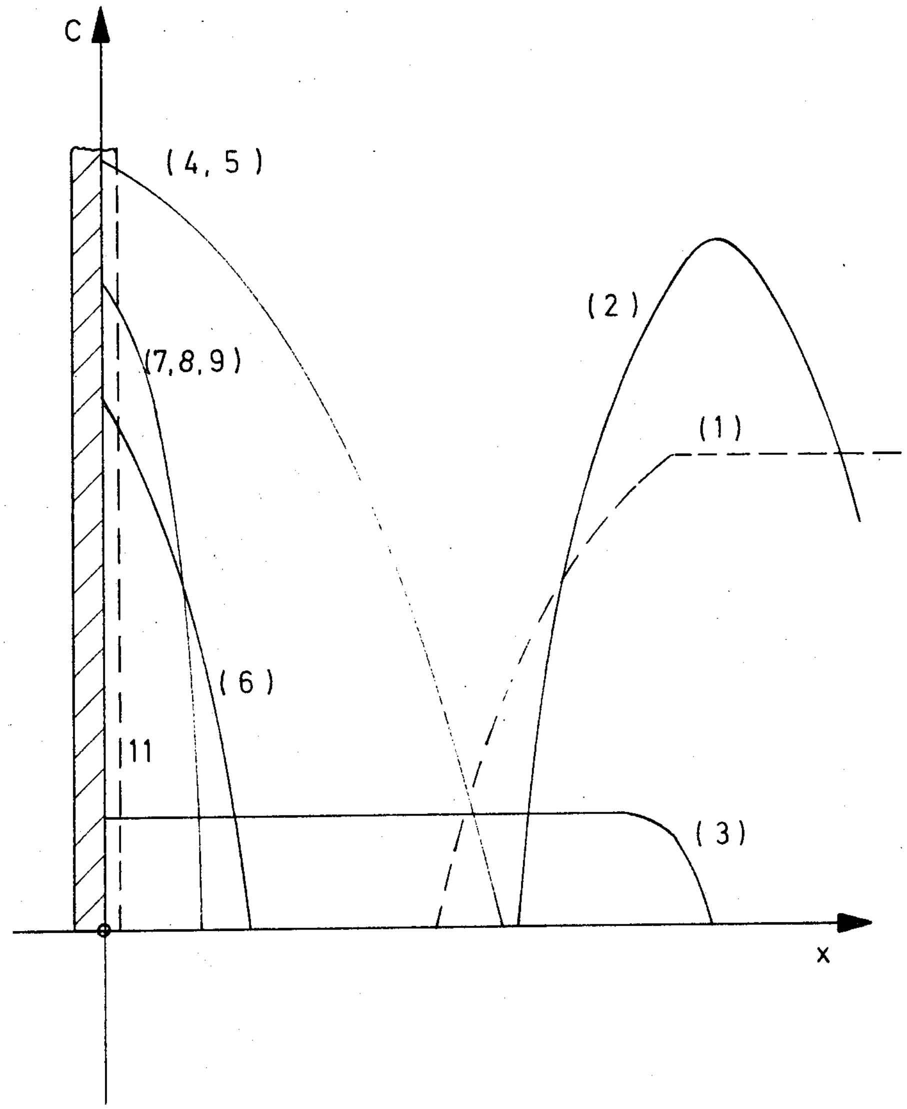
FIG. 9 shows the concentration profiles below the contacting point in the semiconductor body.

FIG. 9 illustrates the doping concentration profiles in a perpendicular direction in relation to the semiconductor surface below the contacting area of the base electrode 10. The ordinate axis shows the doping concentration, and the abscissa axis shows the depth. On either side of the origin of coordinates is the semiconductor surface. The contacting layer extends to the left of the origin, and immediately adjacent thereto, towards the right, there extends the layer as limited by the dashed line 11, and into which the contact metal was brought by way of the aforementioned thermal-treatment. As parameters on the curves there are shown the reference numerals of the respective zones in FIGS. 1 to 8.

In regard to the doping of the surface zone 9 which is carried out simultaneously with the doping of the emitter zone 7 in the example of embodiment explained hereinbefore, it should be noted that besides for there being an upper limit for the doping level of the surface concentration of the surface zone 9 which corresponds to the doping concentration of the contact zone 5 on the semiconductor surface, there is a lower limit determined by the doping level of the emitter zone 6, limiting the current gain of the planar transistor component. Incidentally, in the case of lower surface concentrations, the efficiency of the phosphorous doping below the contact metal is diminished with respect to the improvement in the low-ohmic contact.

It is assumed that improvement in the ohmic contact is based on the formation of a compound with, or the alloying of phosphorous with the contacting metal. It has actually been proved that the zones diffused with phosphorous are contacted noticeably better than the zones diffused with boron, and that after removing or peeling off the contact metal, the zones diffused with phosphorous, differ microscopically on their surfaces from the zones diffused with boron. Accordingly, the use of the method according to the invention is particularly favorable for the contacting of boron doped zones.

Besides obtaining an improved contact, we will have the advantage of saving one complete photolithographic process step and one oxidation process step (last oxidation), because the window for the base contact is already opened during emitter diffusion. Since this emitter diffusion takes place in an inert and somewhat reducing protective gas atmosphere owing to the presence of phosphine $PH_3$, there is practically no pure electrically inactive phosphorous precipitated on to the semiconductor surface which would be likely to attack the silicon-oxide masking and the exposed semiconductor surface.

Accordingly, the contact metal may be deposited immediately after the last photolithographic process step following the emitter diffusion. In the course of a further photolithographic process step for manufacturing the strip lines from the contact metal there might easily be caused short-circuits between the strip lines and the semiconductor body owing to the formation of holes in the oxide masking.

Moreover, since the contact openings or apertures and the diffusion openings or apertures are manufactured together prior to the last diffusion (emitter diffusion), it is possible to achieve smaller safety spacings and, consequently, a reduction in size of both diode structures and transistor structures. Consequently, using the method according to the invention is particularly advantageous since it does not require any additional working process steps. During contacting of the base zone in accordance with the example of embodiment described hereinbefore, the planar diffusion processes are utilized for both the emitter zone and the isolating zones.

It is to be understood that the foregoing description of specific examples of this invention is made by way of example only and is not to be considered as a limitation on its scope.

I claim:

1. A method of forming a low-ohmic contact to the surface of a first p-conductivity type zone on a silicon semiconductor body by the deposition of a contact metal which, as the result of a thermal-treatment, will provide an ohmic contact, comprising the steps of:

forming a p-conductivity type contact zone within said first zone, said contact zone being doped higher than said first zone;

forming an n-conductivity type surface zone within said contact zone by diffusing phosphorous into said contact zone, said phosphorous being of such small doping concentration that said contact zone contacts said contact metal subsequent to said thermal treatment;

evaporating a layer of a contact metal on said semiconductor body;

etching contact leads; and sintering said contact metal into said contact zone resulting in alloying of phosphorous with said contact metal for forming said ohmic contact.

2. A method according to claim 1, wherein said surface zone has a smaller doping concentration than the doping concentration of said contact zone.

3. A method according to claim 1, further comprising an NPN planar transistor formed within said semiconductor body wherein said first zone is the base of said transistor and said contact zone has a higher doping concentration than said base zone.

4. A method according to claim 3, further comprising a p-conductivity substrate beneath said body, and an isolating zone surrounding said transistor and extending to said substrate, wherein said isolating zone and contact zone are formed simultaneously during a diffusion step using boron as the doping material.

5. A method according to claim 3, wherein said surface zone is diffused in simultaneously with said emitter zone.

6. A method according to claim 1, wherein said surface zone is diffused in an oxygen-free atmosphere.

7. A method according to claim 6, wherein said surface zone diffusion is carried out in an atmosphere containing an inert carrier gas of nitrogen or argon, and phosphine.

8. A method according to claim 1, wherein said contact zone is diffused into a highly doped n-type intermediate layer.

9. A method according to claim 1, wherein said contact metal is selected from a group consisting of aluminum or nickel.

* * * * *